US012293803B2

(12) United States Patent
Yu et al.

(10) Patent No.: US 12,293,803 B2
(45) Date of Patent: May 6, 2025

(54) BUILT-IN SELF-TEST BURST PATTERNS BASED ON ARCHITECTURE OF MEMORY

(71) Applicant: Micron Technology, Inc., Boise, ID (US)

(72) Inventors: William Yu, Boise, ID (US); Daniele Balluchi, Cernusco Sul Naviglio (IT); Chad B. Erickson, Boise, ID (US); Danilo Caraccio, Milan (IT)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 17/943,706

(22) Filed: Sep. 13, 2022

(65) Prior Publication Data

US 2024/0087664 A1 Mar. 14, 2024

(51) Int. Cl.
*G11C 16/04* (2006.01)
*G11C 29/10* (2006.01)
*G11C 29/12* (2006.01)
*G11C 29/38* (2006.01)

(52) U.S. Cl.
CPC .............. *G11C 29/38* (2013.01); *G11C 29/10* (2013.01); *G11C 29/1201* (2013.01)

(58) Field of Classification Search
CPC ...... G11C 29/38; G11C 29/10; G11C 29/1201
See application file for complete search history.

(56) References Cited

U.S. PATENT DOCUMENTS

| | | | |
|---|---|---|---|
| 7,447,953 B2 | 11/2008 | Vogt | |
| 7,721,175 B2 * | 5/2010 | Resnick | ........... G11C 29/16 |
| | | | 714/733 |
| 7,937,631 B2 | 5/2011 | Vogelsang | |
| 8,456,934 B2 | 6/2013 | Best et al. | |
| 8,914,688 B2 | 12/2014 | Belansek et al. | |
| 8,924,805 B2 | 12/2014 | Sul et al. | |
| 8,988,956 B2 | 3/2015 | Chopra | |
| 9,679,664 B2 | 6/2017 | Ong | |
| 10,007,588 B2 * | 6/2018 | Shao | ............ G11C 29/14 |
| 2012/0198294 A1 * | 8/2012 | Nadeau-Dostie | ...... G11C 29/32 |
| | | | 714/719 |

* cited by examiner

*Primary Examiner* — Pho M Luu
(74) *Attorney, Agent, or Firm* — Brooks, Cameron & Huebsch, PLLC

(57) ABSTRACT

Methods, systems, and devices related to built-in self-test burst patterns based on architecture of memory. A controller can be coupled to a memory device. The controller can include built-in self-test (BIST) circuitry. The BIST circuitry can include registers configured to store respective write burst patterns and read burst patterns based on an architecture of the memory device.

17 Claims, 4 Drawing Sheets

FIG. 4

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| | | | | | | | | | | | | | | | | | BL32 | | | | | | | | | | | | | | | |
| 470-0 DQ[7:0] | 00h | 00h | 00h | 00h | FFh | FFh | FFh | FFh | 00h | 00h | 00h | 00h | FFh | FFh | FFh | FFh | 00h | 00h | 00h | 00h | FFh | FFh | FFh | FFh | 00h | 00h | 00h | 00h | FFh | FFh | FFh | FFh |
| 470 | | | | | | | | | | | | | PCHK_0: xROW0PATTERN | | | | | | | | | | | | | | | | | | | |
| 470-0 DQ[7:0] | FFh | FFh | FFh | FFh | 00h | 00h | 00h | 00h | FFh | FFh | FFh | FFh | 00h | 00h | 00h | 00h | FFh | FFh | FFh | FFh | 00h | 00h | 00h | 00h | FFh | FFh | FFh | FFh | 00h | 00h | 00h | 00h |
| | | | | | | | | | | | | | PCHK_0: xROW1PATTERN | | | | | | | | | | | | | | | | | | | |
| 471-0 DQ[7:0] | FFh | FFh | FFh | FFh | FFh | FFh | FFh | FFh | FFh | FFh | FFh | FFh | FFh | FFh | FFh | FFh | 00h | 00h | 00h | 00h | 00h | 00h | 00h | 00h | 00h | 00h | 00h | 00h | 00h | 00h | 00h | 00h |
| 471 | | | | | | | | | | | | | ROW STRIPES, CELL COL STRIPES: xROW0PATTERN | | | | | | | | | | | | | | | | | | | |
| 471-1 DQ[7:0] | 00h | 00h | 00h | 00h | 00h | 00h | 00h | 00h | 00h | 00h | 00h | 00h | 00h | 00h | 00h | 00h | FFh | FFh | FFh | FFh | FFh | FFh | FFh | FFh | FFh | FFh | FFh | FFh | FFh | FFh | FFh | FFh |
| | | | | | | | | | | | | | ROW STRIPES, CELL COL STRIPES: xROW1PATTERN | | | | | | | | | | | | | | | | | | | |
| 472-0 DQ[7:0] | 00h | 00h | FFh | FFh | 00h | 00h | FFh | FFh | 00h | 00h | FFh | FFh | 00h | 00h | FFh | FFh | 00h | 00h | FFh | FFh | 00h | 00h | FFh | FFh | 00h | 00h | FFh | FFh | 00h | 00h | FFh | FFh |
| 472 | | | | | | | | | | | | | IOCHK0: xROW0PATTERN | | | | | | | | | | | | | | | | | | | |
| 472-1 DQ[7:0] | FFh | FFh | 00h | 00h | FFh | FFh | 00h | 00h | FFh | FFh | 00h | 00h | FFh | FFh | 00h | 00h | FFh | FFh | 00h | 00h | FFh | FFh | 00h | 00h | FFh | FFh | 00h | 00h | FFh | FFh | 00h | 00h |
| | | | | | | | | | | | | | IOCHK0: xROW1PATTERN | | | | | | | | | | | | | | | | | | | |

BUILT-IN SELF-TEST BURST PATTERNS BASED ON ARCHITECTURE OF MEMORY

TECHNICAL FIELD

The present disclosure relates generally to semiconductor memory and methods, and more particularly, to apparatuses, systems, and methods of built-in self-test (BIST) burst patterns based on architecture of memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes Random Access Memory (RAM), Dynamic Random Access Memory (DRAM), Static Random Access Memory (SRAM), Synchronous Dynamic Random Access Memory (SDRAM), and Thyristor Random Access Memory (TRAM), among others. Non-volatile memory can provide persistent data by retaining stored data when not powered and can include NAND flash memory, NOR flash memory, Ferroelectric Random Access Memory (FeRAM), and resistance variable memory such as Phase Change Random Access Memory (PCRAM), Resistive Random Access Memory (RRAM), and Magnetoresistive Random Access Memory (MRAM), such as Spin Torque Transfer Random Access Memory (STTRAM), among others.

Memory devices may be coupled to a host (e.g., a host computing device) to store data, commands (also referred to as requests), and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

BRIEF DESCRIPTION OF THE DRAWINGS

FIG. 4 illustrates example burst patterns used in association with a BIST operation in accordance with a number of embodiments of the present disclosure.

DETAILED DESCRIPTION

Figure 1:
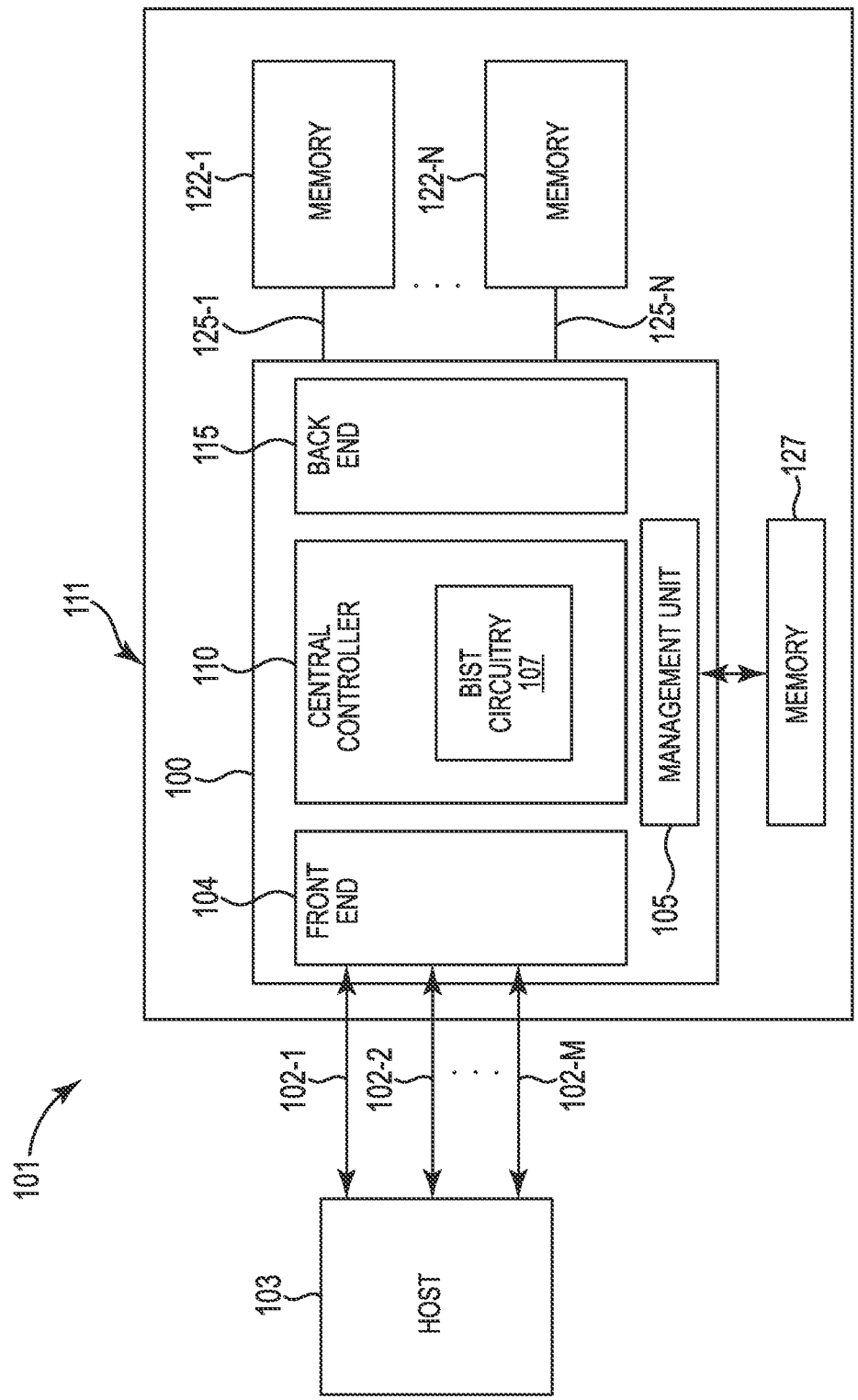
FIG. 1 illustrates a functional block diagram in the form of a computing system including a memory module including a controller for built-in self-test (BIST) of a memory device using burst patterns based on architecture of the memory device in accordance with a number of embodiments of the present disclosure.

Systems, apparatuses, and methods related to built-in self-test (BIST) burst patterns based on architecture (e.g., topographic architecture) of memory are described. As used herein, "architecture" of a memory or memory device refers to a physical arrangement of components (e.g., conductive lines, memory cells, access devices, etc.) of the memory or memory device. As used herein, "burst pattern" refers to a sequence of bits written to and/or read from memory to detect problems, damage, and/or defects of the memory device. Some previous approaches may include performing operations associated with BIST (also referred to herein as BIST operations) using burst patterns that are not specific to a type of memory on which the BIST operations are performed. For instance, a controller of a memory module may perform BIST operations on one or more memory devices of the memory module using burst patterns provided with (e.g., pre-loaded on) the controller. Because the controller may be used with multiple types of memory, the burst patterns provided with a controller may be used to perform BIST operations on multiple types of memory. However, BIST operations performed using burst patterns that are not specific to a type of memory may be incapable of detecting particular problems, damage, and/or defects associated with a specific type of memory.

Some previous approaches include using multiple combination of burst patterns irrespective of (with no knowledge of) the type of the memory and/or topographical architecture of the memory device. Burst patterns that are not specific to a type of memory may not take in account characteristics of an architecture of that type of memory. For example, some previous approaches may include burst patterns that do not consider how errors are generated on DRAM device because vendors of DRAM devices have proprietary information. Previous approaches may detect and address gross errors and/or defects of a memory device, but with a low probability of detecting intermittent and soft errors of the memory device without running additional test stresses and/or using multiple burst patterns.

In some previous approaches, each memory device of a memory module may have a respective memory controller and each memory controller may circuitry to perform BIST operations on the memory device coupled thereto. For example, if a memory module has four memory devices, then the memory module may have four memory controllers. Thus, in some previous approaches, a memory module may include four instances of circuitry to perform BIST operations. Multiple instances of such circuitry may increase die sizes and resource consumption of a memory module without the costs associated with some previous approaches that include performing BIST operations using firmware.

Aspects of the present disclosure address the above and other deficiencies of previous approaches. Some embodiments of the present disclosure include performing BIST operations using one or more burst patterns that are specific to a type of memory (e.g., DRAM) on which the BIST operations are performed. For instance, some embodiments include performing BIST operations on a memory device using a burst pattern that is based on architecture of the memory device. In contrast to previous approaches, the burst patterns based on the architecture of the memory device can detect problems, damage, and/or defects of that particular type of memory. In some embodiments, the burst patterns can be user-defined. User-defined burst patterns facilitate tailoring the burst patterns to a memory device on which BIST operations, using the burst patterns, are performed.

Embodiments of the present disclosure include various types of memory and/or memory devices that can have different architectures (e.g., topographic architecture) that have a multitude of different physical characteristics and/or operating characteristics that affect BIST of the memory and/or memory devices. Non-limiting examples of physical characteristics of memory and memory devices include how many memory dies and size(s) thereof, how many memory banks and size(s) thereof, how many input/output (I/O) pins, and how many row buffers and size(s) thereof. The arrangement of memory and/or memory devices can differ. For example, memory devices (or memory dies thereof) can be placed in close proximity (e.g., "clam shell") such that operation of one memory die may affect another memory die (e.g., induction, capacitive, coupling, etc.). Embodiments of the present disclosure can enable BIST of memory and/or memory devices and/or burst patterns used therewith to be detect issues caused by known interactions in particular arrangements of memory and memory devices. Addressing of memory and/or a memory device can differ, relative to a different memory and/or memory device, based on the particular physical characteristics of the memory and/or memory devices. For instance, DRAM has physical characteristics and operating characteristics than FeRAM.

Some embodiments can reduce costs of testing memory devices while improving the quality of the testing because the burst pattern is tailored to a particular type of memory. The quality of the testing can be improved because a burst pattern can based on known problems of silicon technology such that failure analysis segmentation of the testing is completed faster. Some previous approaches that utilize firmware (e.g., manufacturing test firmware) to perform BIST operation, the cost of testing memory devices using may be two to three times greater than the cost of performing BIST operations in accordance with the present disclosure.

Some embodiments include circuitry of a controller coupled to multiple memory devices that can perform BIST operations on the memory devices (also referred to herein as BIST circuitry). In contrast to previous approaches that include multiple instances of BIST circuitry, some embodiments of the present disclosure can include a single instance of BIST circuitry (e.g., within the controller) capable of performing BIST operations on multiple memory devices. Using a single instance of BIST circuitry can reduce die sizes and/or the size of the memory module and/or resource consumption by the memory module.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 107 can represent element 7 in FIG. 1, and a similar element can be labeled 207 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates a functional block diagram in the form of a computing system 101 including a memory module 111 including a controller 100 (which may be referred to as a "memory controller") of a memory device 122 for BIST of the memory device 122 using burst patterns based on architecture of the memory device 122 in accordance with a number of embodiments of the present disclosure. The computing system 101 includes a memory module 111. The memory module 111 can include the controller 100 and one or more memories and/or memory devices coupled thereto.

The controller 100 can include a front end portion 104, a central controller portion 110, and a back end portion 115. The computing system 101 can further include a host 103, memory devices 122-1, . . . , 122-N (collectively referred to as memory devices 122), and a memory 127. The memory 127 can be a flash memory accessible via a serial peripheral interface (SPI). The memory 127 can include other circuitry, firmware, software, or the like, whether alone or in combination.

The front end portion 104 includes an interface to couple the controller 100 to the host 103 through input/output (I/O) lanes 102-1, 102-2, . . . , 102-M (collectively referred to as I/O lanes 102). The front end portion 104 includes interface management circuitry to manage the I/O lanes 102. The front end portion 104 can include any quantity of the I/O lanes 102 (e.g., eight, sixteen I/O lanes 102). In some embodiments, the I/O lanes 102 can be configured as a single port. In some embodiments, the interface between the controller 100 and the host 103 can be a Peripheral Component Interconnect express (PCIe) physical and electrical interface operated according to a Compute Express Link (CXL) protocol.

In some embodiments, the computing system 101 can be a CXL compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as I/O protocol, memory protocol (e.g., initially allowing a host to share memory with an accelerator), and coherency interface.

The back end portion 115 can include media control circuitry and a physical (PHY) layer that couples the controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N (collectively referred to as the channels 125). The channels 125 can include a sixteen-pin data bus and a two pin data mask inversion (DMI) bus, for example, among other possible buses. The channels 125 can each include an input/output data (DQ) bus and a data strobe (DQS) bus. The back end portion 115 can communicate (e.g., transmit and/or receive) data to and/or from the memory devices 122 via the data pins.

One or more of the memory devices 122 can include DRAM. DRAM can be operated according to a protocol, such as low-power double data rate (LPDDRx), (e.g., LPDDRx DRAM devices, LPDDRx memory, etc.). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled. In some embodiments, the memory devices 122 are LPDDRx memory devices, but the memory devices 122 do not include circuitry configured to provide low-power functionality, such as a dynamic voltage frequency scaling core (DVFSC), a sub-threshold current reduce circuit (SCRC), or other low-power functionality providing circuitry. The LPDDRx memory devices 122 without such circuitry can advantageously reduce the cost, size, and/or complexity of the LPDDRx memory devices 122. By way of example, an LPDDRx memory device with reduced low-power functionality providing circuitry can be used for applications other than mobile applications (e.g., if the memory is not intended to be used in a mobile application, some or all low-power functionality can be sacrificed for a reduction in the cost of producing the memory). One or more of the memory devices 122 can include FeRAM, PCRAM, RRAM, MRAM, and STTRAM, among others.

The memory devices 122 are not limited to a particular type of memory device. For instance, the memory devices 122 can include RAM, ROM, DRAM, SDRAM, PCRAM, RRAM, and flash memory, among others. The memory devices 122 can include non-volatile memory devices such as non-volatile random-access memory devices (e.g., NVRAM, ReRAM, FeRAM, MRAM, PCM), "emerging" memory devices such as a ferroelectric RAM device that includes ferroelectric capacitors that can exhibit hysteresis characteristics, a 3-D Crosspoint (3D XP) memory device, etc., or combinations thereof.

As an example, a FeRAM device can include ferroelectric capacitors and can perform bit storage based on an amount of voltage or charge applied thereto. In such examples, relatively small and relatively large voltages allow the ferroelectric RAM device to exhibit characteristics similar to normal dielectric materials (e.g., dielectric materials that have a relatively high dielectric constant) but at various voltages between such relatively small and large voltages the FeRAM device can exhibit a polarization reversal that yields non-linear dielectric behavior.

As another example, a 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation in which a non-volatile memory cell can be programmed without the non-volatile memory cell being previously erased.

In some embodiments, the controller 100 can include a management unit 105 to initialize, configure, and/or monitor characteristics of the controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

The central controller portion 110 can control, in response to receiving a memory access request from the host 103, for example, performance of one or more memory operations. Non-limiting examples of memory operations include a memory operation to read data from a memory device 122 and an operation to write data to a memory device 122. In some embodiments, the central controller portion 110 can control writing of multiple pages of data substantially simultaneously.

As used herein, the term "substantially" intends that the characteristic may not be absolute, but is close enough so as to achieve the advantages of the characteristic. For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "substantially simultaneously" may not start or finish at exactly the same time. For example, the multiple memory controllers can be utilized such that they are writing data to the memory devices at the same time regardless if one of the media controllers commences or terminates prior to the other.

The central controller portion 110 can include BIST circuitry 107. However, in some embodiments, the BIST circuitry 107, or a portion thereof, can be a component of the controller 100 other than the central controller portion 110 or external to the controller 100. The BIST circuitry 107 can include one or more registers to store burst patterns. One or more of the registers can store burst patterns associated with write operations of BIST operations (also referred herein to as write burst patterns). One or more of the registers can store burst patterns associated with read operations of BIST operations (also referred herein to as read burst patterns). The BIST circuitry 107 can perform BIST operations on one or more of the memory devices 122 substantially simultaneously. In some embodiments, the functionality of the BIST circuitry 107 described herein can be implemented in firmware, hardware, and combinations thereof.

Figure 2:
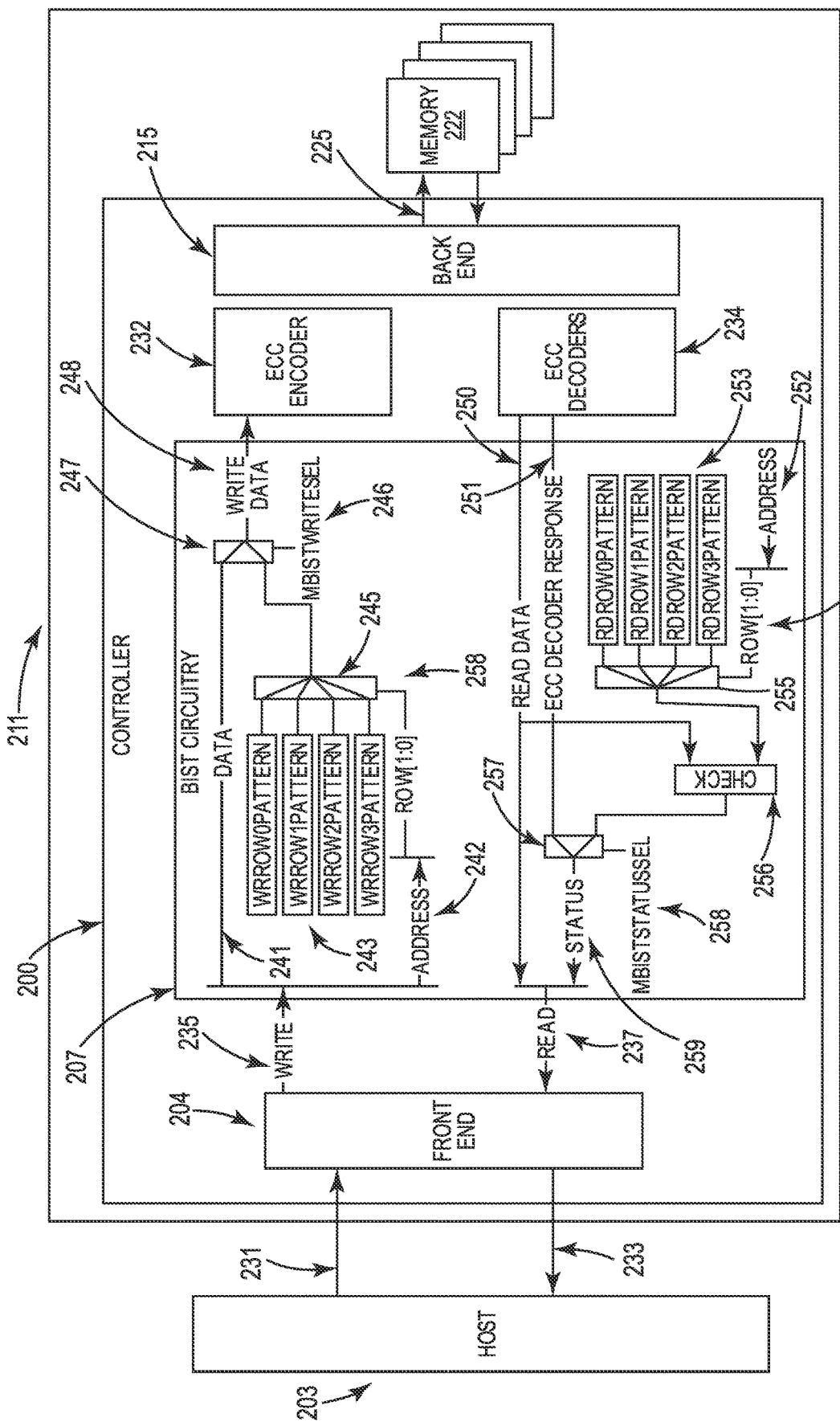
FIG. 2 illustrates a block diagram of a controller in accordance with a number of embodiments of the present disclosure.

FIG. 2 illustrates a block diagram of a controller 200 in accordance with a number of embodiments of the present disclosure. For clarity, FIG. 2 has been simplified to focus on the BIST circuitry 207. The host 203, front end portion 204, BIST circuitry 207, back end portion 213, and memory devices 222 can be analogous to the host 103, front end portion 104, BIST circuitry 107, back end portion 113, and memory devices 122 described in association with FIG. 1. FIG. 2 does not illustrate a "box" for the central controller portion of the controller 200 for clarity. However, the BIST circuitry 207 illustrated by FIG. 2 is a component of the central controller portion of the controller 200.

The BIST circuitry 207 can include a number of registers 243 to store write burst patterns. FIG. 2 illustrates four registers 243; however, embodiments of the present disclosure are not so limited. The registers 243 can include fewer than or greater than four registers. Each of the registers 243 can store a different write burst pattern. A command to perform a BIST operation (also referred to herein as a BIST command), as well as write commands and read commands, can be received by the controller 200 from the host 203 at 231 (e.g., via one or more of the I/O lanes 102 described in association with FIG. 1). A BIST command can be received as a bit string. As used herein, "BIST command" refers to signaling and/or instructions indicative of write operations and/or read operations to perform in association with a BIST operation and "BIST configuration command" refers to signaling and/or instructions indicative of configurations of the BIST circuitry 207, a type of BIST operation, and/or how to perform a BIST operation. Although a BIST command is described separately from a BIST configuration command for clarity, a BIST command and a BIST configuration command can be communicated to the BIST circuitry 207 together (e.g., intermingled).

The front end portion 204 can be an interface between the host 203 and the controller 200 (e.g., the central controller portion). A write command can be received, at 235, by the BIST circuitry 207. A write command can be in association with a BIST command or independent of (not associated with) a BIST command. A write command can include, at 241, data to be written to one or more of the memory devices 222 and, at 242, an address at which the data or a write burst pattern is to be written. In some embodiments, selection of one or more of the registers 243 can be based on an indication provided by a BIST command or a BIST configuration command, at 235, (or write command associated with a BIST command). In some embodiments, selection of one or more of the registers 243 can be based on an indication stored in a control register (not illustrated by FIG. 2) rather than provided by a BIST command or a BIST configuration command.

The BIST circuitry 207 can include a multiplexer (MUX) 245 coupled to the registers 243. A BIST command can include an indication of which and/or how many burst patterns to write to one or more of the memory devices 222. As indicated at 258, an address of the memory devices 222, or a portion thereof, can be provided to the MUX 245 as a selection signal. For example, if a BIST command indicates that a single write burst pattern is to be used, then the burst pattern stored in WrRow0Pattern register of the registers 243 can be selected. If a BIST command indicates that two write burst patterns are to be used, then the burst patterns stored in WrRow0Pattern and WrRow1Pattern registers of the registers 243 can be selected. If a BIST command indicates that four write burst patterns are to be used, then the burst patterns stored in WrRow0Pattern, WrRow1Pattern, WrRow2Pattern, and WrRow3Pattern registers of the registers 243 can be selected.

The BIST circuitry 207 can include another MUX 247. Data to be written to one or more of the memory devices 222 (independent of a BIST command, for example) can be an input of the MUX 247. The output of the MUX 245 (one or more write burst patterns) can be another input of the MUX 247. A selection signal (MBISTwriteSel) 246 provided to the MUX 247 that is indicative of whether, at 248, the data or one or more write burst patterns is output by the MUX 247 is to be output by the BIST circuitry 207. For example, if the write command is independent of a BIST command, then the selection signal 246 can be such that the data, at 241, is selected. If the write command is associated with a BIST command, then the selection signal 246 can be such that the output of the MUX 245 (one or more write burst patterns) is selected.

At 248, the output of the MUX 247 can be input into an error correction code (ECC) encoder 232. However, some embodiments do not include an ECC encoder. The ECC encoder 232 is illustrated as distinct from the back end portion 215. However, in some embodiments, the ECC encoder 232 can be a component of the back end portion 215. The ECC encoder 232 can be operated based on various types of ECC, such as Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others. As a non-limiting example, the ECC encoder 232 can be operated based on Hamming code and generate parity symbols (as ECC symbols). The ECC encoder 232 can include circuitry and/or firmware in order to perform ECC operations.

Although not illustrated by FIG. 2, the back end portion 215 can include respective memory controllers corresponding to and/or coupled to the memory devices 222. The back end portion 215 can be an interface between the controller 200 (e.g., the central controller portion) and the memory devices 222. The back end portion 215 can be coupled to the memory devices 222 via the channels 225.

The BIST circuitry 207 can include a number of registers 253 to store read burst patterns. FIG. 2 illustrates four registers 253; however, embodiments of the present disclosure are not so limited. The registers 253 can include fewer than or greater than four registers. Each of the registers 253 can store a different read burst pattern. The read burst patterns can be compared to data read from the memory devices 222.

In some embodiments, selection of one or more of the registers 253 can be based on an indication provided by a BIST command or a BIST configuration command, received by the BIST circuitry 207 at 235, (or read command associated with the BIST command). A BIST command can include an indication of which and/or how many burst patterns to compare to data read from one or more of the memory devices 222. In some embodiments, selection of one or more of the registers 253 can be based on an indication stored in a control register (not illustrated by FIG. 2) rather than provided by a BIST command or a BIST configuration command. A MUX 255 can be coupled to the registers 253. As illustrated at 254, an address, or a portion thereof (at 252) of a BIST command, or a read command associated therewith, can be a selection signal provided to the MUX 255. For example, if a BIST command indicates that a single read burst pattern is to be used, then the burst pattern stored in RdRow0Pattern register of the registers 253 can be selected. If a BIST command indicates that two read burst patterns are to be used, then the burst patterns stored in RdRow0Pattern and RdRow1Pattern registers of the registers 253 can be selected. If a BIST command indicates that four read burst patterns are to be used, then the burst patterns stored in RdRow0Pattern, RdRow1Pattern, RdRow2Pattern, and RdRow3Pattern registers of the registers 253 can be selected.

A read command can be received by, at 235, the BIST circuitry 207. The read command can be in association with a BIST command or independent of (not associated with) a BIST command. The read command can include an address (at 252) at which data is to be read. Data read from the memory devices 222 can be input to an ECC decoder 234. However, some embodiments do not include an ECC decoder. The ECC decoder 234 is illustrated as distinct from the back end portion 215. However, in some embodiments, the ECC decoder 234 can be a component of the back end portion 215. The ECC decoder 234 can be operated based on various types of ECC, such as Hamming codes, RS codes, BCH codes, CRC codes, Golay codes, Reed-Muller codes, Goppa codes, and Denniston codes, among others. As a non-limiting example, the ECC decoder 234 can be operated based on Hamming code and decode parity symbols (as ECC symbols). The ECC decoder 234 can include circuitry and/or firmware in order to perform ECC operations. As illustrated at 251, a response can be output from the ECC decoder 234. The response can be indicative of whether data read from the memory devices 222 include an error.

The BIST circuitry 207 can include comparison circuitry 256 (e.g., a comparator) to compare, at 250, data read from the memory devices 222 to the one or more read burst patterns output from the MUX 255. The output of the comparison circuitry 256 can be indicative of whether there is a mismatch between the data and the read burst patterns.

The BIST circuitry 207 can include another MUX 257 that receives, at 251, the response from the ECC decoder 234 and the output of the comparison circuitry 256. A selection signal (MBISTstatusSel) 258 can be provided to the MUX 257 that is indicative of whether, at 259, the response from the ECC decoder 234 or the output of the comparison circuitry 256 is to be output by the BIST circuitry 207. For instance, if data is read in association with a read command independent of a BIST command, then the selection signal 258 can be such that the response from the ECC decoder 234 is output at 259. In contrast, if data is read in association with a BIST command, then the selection signal 258 can be such that the output of the comparison circuitry is output at 259.

As illustrated at 233, a response to a BIST command (as well as responses to write commands and read commands) can be communicated by the controller 200 to the host 203 (e.g., via one or more of the I/O lanes 102). The response to a BIST command can include an indication of whether data read from one or more of the memory devices 222 matches one or more read burst patterns. In some embodiments, write burst patterns, stored in the registers 243, can correspond to (e.g., be the same as) read burst patterns, stored in the registers 253. For example, performing a BIST operation can include performing a write operation to write one or more of the burst patterns stored in the registers 243 to one or more of the memory devices 222 at one or more addresses. Then, a read operation can be performed at the addresses and the read data can be compared, using the comparison circuitry 256, to one or more burst patterns stored in the registers 253. Although FIG. 2 illustrates the registers 243 as distinct from the registers 253, in some embodiments, the registers 243 and 253 can be coupled to one another. In some embodiments in which read burst patterns are the same as write burst patterns, a burst pattern stored in a register can be written to the memory devices 222 as well as compared to data read from the memory devices 222. In some embodiments, writing burst patterns to one or more of the memory devices 222 can occur substantially simultaneously with reading burst patterns from one or more of the memory devices 222.

Although not illustrated by FIG. 2, the BIST circuitry 207 can include one or more registers associated with control of a BIST operation (also referred to herein as control registers). A BIST configuration command can cause changes to bits stored in a control register. For example, a BIST configuration command can be a bit string stored in a control register. A bit of a control register can cause a write functionality of the BIST circuitry 207 to be enabled. For example, if this bit is set to one, then the BIST circuitry 207 can cause one or more write burst patterns (stored in the registers 243) to be written to the memory devices 222 instead of data received by the controller 200 in association with a write command. A bit of a control register can cause the BIST functionality of the BIST circuitry 207 to be enabled. For example, if this bit is set to one, then the BIST circuitry 207 can cause data read from the memory devices 222 to be compared to one or more read burst patterns (stored in the registers 253). As described herein, if the read data matches the read burst patterns, then the BIST circuitry 207 can output an indication that there are no errors. If the read data does not match the read burst patterns, then the BIST circuitry 207 can output an indication that there is an error (e.g., an uncorrectable error). A bit of a control register can cause ECC circuitry (e.g., the ECC encoder 232 and the ECC decoder 234) to be disabled or enabled. One or more bits of a control register can be indicative of a type of BIST operation to perform. For example, one type of BIST operation can include using a single burst pattern and another type of BIST operation can include using multiple burst patterns. The bits of a control register can indicate which of the write burst patterns stored in the registers 243 to use in association with a BIST operation and/or which of the read burst patterns stored in the registers 253 to use in association with a BIST operation. A bit of a control register can cause the BIST circuitry 207 to write data to the memory devices 222 only in association with a BIST operation. A bit of a control register can cause the BIST circuitry 207 to read data from the memory devices 222 only in association with a BIST operation.

Figure 3:
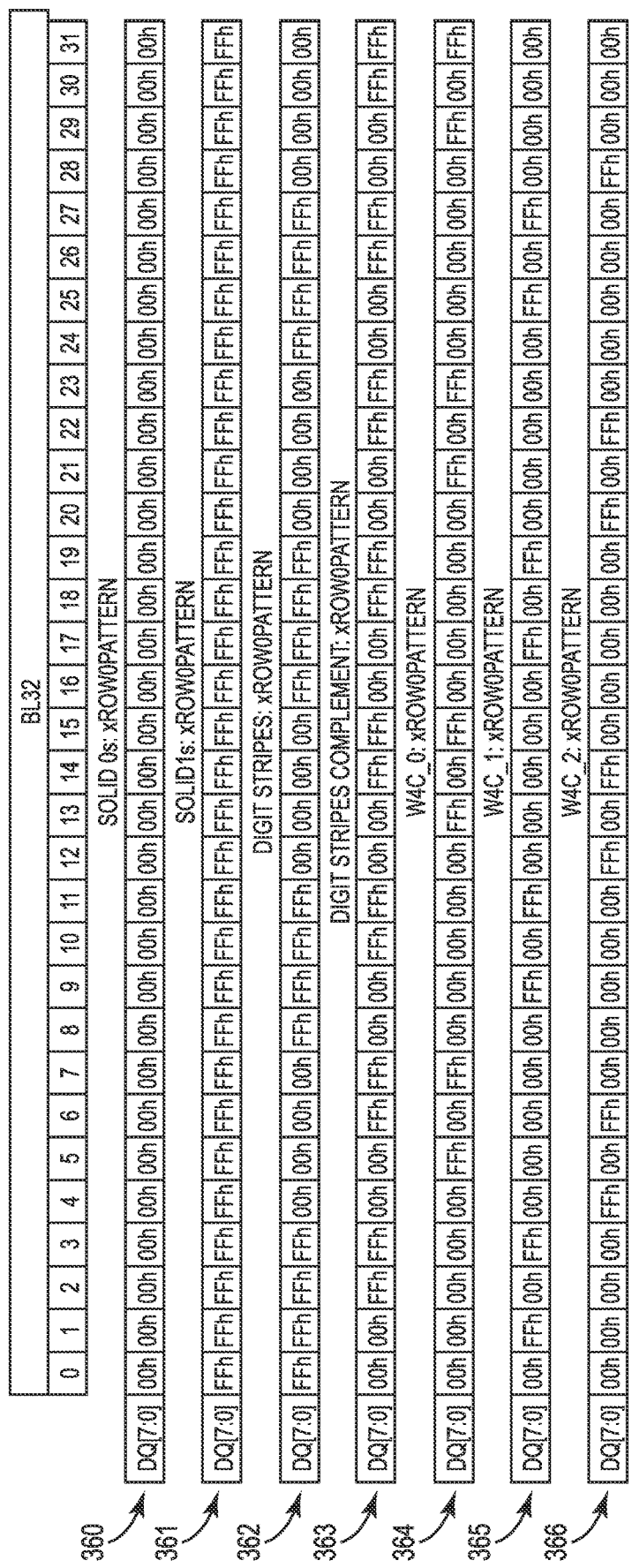
FIG. 3 illustrates example burst patterns used in association with a BIST operation in accordance with a number of embodiments of the present disclosure.

FIG. 3 illustrates example burst patterns 360, 361, 362, 363, 364, 365, and 366 used in association with a BIST operation in accordance with a number of embodiments of the present disclosure. The burst patterns 360-366 can be used as write burst patterns (written to a memory device, such as one of the memory devices 222 described in association with FIG. 2) and/or read burst patterns (compared to data read from a memory device, such as one of the memory devices 222). The burst patterns 360-366 are 32 bits long; however, embodiments are not so limited. For example, burst patterns can be less than 32 bits long (e.g., 16 bits) or greater than 32 bits long (e.g., 64 bits). The burst patterns 360-366 can write to and/or read from a memory device via a DQ bus as indicated by DQ[7:0].

The burst patterns 360-366 can be used individually. Any one of the burst patterns 360-366 can be stored in WrRow0Pattern register of the registers 243 (when used as a write burst pattern) and/or RdRow0Pattern register of the registers 253 (when used as a read burst pattern), for example. The burst pattern 361 includes all zeroes (00h). The burst pattern 361 includes all ones (FFh). The burst pattern 362 alternates between zeros (00h) and ones (FFh) for digit line stripes and the burst pattern 363 is the complement of the burst pattern 362. The burst patterns 364-366 include irregular distributions of ones (FFh) and zeroes (00h) where the quantity of ones (FFh) is fewer than the quantity of zeroes (00h).

FIG. 4 illustrates example burst patterns 470, 471, and 472 used in association with a BIST operation in accordance with a number of embodiments of the present disclosure. The burst patterns 470, 471, and 472 can be used as write burst patterns (written to a memory device, such as one of the memory devices 222 described in association with FIG. 2) and/or read burst patterns (compared to data read from a memory device, such as one of the memory devices 222). The burst patterns 470, 471, and 472 are 32 bits long; however, embodiments are not so limited. For example, burst patterns can be less than 32 bits long (e.g., 16 bits) or greater than 32 bits long (e.g., 64 bits). The burst patterns 470, 471, and 472 can write to and/or read from a memory device via a DQ bus as indicated by DQ[7:0].

In contrast to the burst patterns 360-366 described in association with FIG. 3, the burst patterns 470, 471, and 472 can be used in pairs. A portion 470-0 of the burst pattern 470 can be written to and/or read from a row of a memory device and another portion 470-1 of the burst pattern 470 can be written to an adjacent row of the memory device. The portion 470-0 of the burst pattern 470 can be stored in WrRow0Pattern register of the registers 243 (when used as a write burst pattern) and/or RdRow0Pattern register of the registers 253 (when used as a read burst pattern). The portion 470-1 of the burst pattern 470 can be stored in WrRow1Pattern register of the registers 243 (when used as a write burst pattern) and/or RdRow1Pattern register of the registers 253 (when used as a read burst pattern). The burst pattern 470 can be referred to as a checkerboard pattern. For example, the portion 470-0 of the burst pattern 470 includes four zeroes (00h) followed by four ones (FFh) repeating. The portion 470-1 of the burst pattern 470 is the complement of the portion 470-0.

A portion 471-0 of the burst pattern 471 can be written to and/or read from a row of a memory device and another portion 471-1 of the burst pattern 471 can be written to an adjacent row of the memory device. The portion 470-0 of the burst pattern 470 can be stored in WrRow0Pattern register of the registers 243 (when used as a write burst pattern) and/or RdRow0Pattern register of the registers 253 (when used as a read burst pattern). The portion 470-1 of the burst pattern 470 can be stored in WrRow1Pattern register of the registers 243 (when used as a write burst pattern) and/or RdRow1Pattern register of the registers 253 (when used as a read burst pattern). The portion 471-0 of the burst pattern 471 includes all ones (FFh) and the portion 471-1 of the burst pattern 471 includes all zeroes (00h).

A portion 472-0 of the burst pattern 472 can be written to and/or read from a row of a memory device and another portion 472-1 of the burst pattern 472 can be written to an adjacent row of the memory device. The portion 472-0 of the burst pattern 472 can be stored in WrRow0Pattern register of the registers 243 (when used as a write burst pattern) and/or RdRow0Pattern register of the registers 253 (when used as a read burst pattern). The portion 472-1 of the burst pattern 472 can be stored in WrRow1Pattern register of the registers 243 (when used as a write burst pattern) and/or RdRow1Pattern register of the registers 253 (when used as a read burst pattern). The burst pattern 472 can be referred to as an I/O checkerboard pattern. For example, the portion 472-0 of the burst pattern 470 includes two zeroes (00h) followed by two ones (FFh) repeating. The portion 472-1 of the burst pattern 472 is the complement of the portion 472-0.

Some embodiments of the present disclosure can include performing a BIST operation on a memory device of a memory module using BIST circuitry of a controller of the memory module. Performing the BIST operation can include retrieving one or more user-defined burst patterns from one or more registers of the BIST circuitry. The user-defined burst patterns can be based on an architecture of the memory device. Performing the BIST operation can include performing a write operation or a read operation on the memory device using the user-defined burst patterns.

In some embodiments, performing a write operation in association with the BIST operation can include writing the user-defined burst patterns to the memory device. Performing the read operation in association with the BIST operation can include determining whether data read from the memory device matches the user-defined burst patterns. The user-defined burst patterns can be received from a host coupled to the controller and written to the registers. A media scan operation can be initiated by a host coupled to the memory module. Performing the BIST operation can be performed in association with performing the media scan operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device; and
a controller coupled to the memory device and comprising built-in self-test (BIST) circuitry comprising:
a first plurality of registers configured to store respective write burst patterns, wherein the write burst patterns are based, at least in part, on an architecture of the memory device; and
a second plurality of registers configured to store respective read burst patterns, wherein the read burst patterns are based, at least in part, on the architecture of the memory device; and
comparison circuitry configured to:
compare data read from the memory device with a selected one of the read burst patterns; and
provide an indication of whether the data read from the memory device corresponds to the selected one of the read burst patterns.

2. The apparatus of claim 1, wherein at least one of the write burst patterns is user-defined.

3. The apparatus of claim 1, wherein at least one of the read burst patterns is user-defined.

4. The apparatus of claim 1, wherein a first register of the first plurality is configured to store a first write burst pattern input by a user and associated with respective BIST operations comprising one, two, and four of the write burst patterns, and
wherein a second register of the first plurality is configured to store a second write burst pattern input by the user and associated with the respective BIST operations comprising two and four of the write burst patterns.

5. The apparatus of claim 4, wherein a third register of the first plurality is configured to store a third write burst pattern input by the user and associated with the BIST operation comprising four of the write burst patterns, and wherein a fourth register of the first plurality is configured to store a fourth write burst pattern input by the user and associated with the BIST operation comprising four of the write burst patterns.

6. The apparatus of claim 1, wherein a first register of the second plurality is configured to store a first read burst pattern input by a user and associated with respective BIST operations comprising one, two, and four of the read burst patterns, and wherein a second register of the second plurality is configured to store a second read burst pattern input by the user and associated with the respective BIST operations comprising two and four of the read burst patterns.

7. The apparatus of claim 6, wherein a third register of the second plurality is configured to store a third read burst pattern input by the user and associated with the BIST operation comprising four of the read burst patterns, and wherein a fourth register of the second plurality is configured to store a fourth read burst pattern input by the user and associated with the BIST operation comprising four of the read burst patterns.

8. The apparatus of claim 1, wherein the memory device comprises a Dynamic Random Access Memory (DRAM) device, and wherein the write burst patterns and the read burst patterns are based, at least in part, on an architecture of the DRAM device.

9. A method, comprising:

performing, using built-in self-test (BIST) circuitry of a controller of a memory module, a BIST operation on a memory device of the memory module, wherein performing the BIST operation comprises:

retrieving a number of user-defined burst patterns from a number of registers of the BIST circuitry, wherein the number of user-defined burst patterns are based, at least in part, on an architecture of the memory device; and performing a write operation or a read operation on the memory device using the number of user-defined burst patterns at an address of the memory device; and determining, in association with performing the BIST operation, whether the data read from the memory device matches the number of user-defined burst patterns.

10. The method of claim 9, wherein performing the write operation comprises writing the number of user-defined burst patterns to the memory device;

where the user-defined burst pattern is carried out in association with a media scan, and is based on the architecture of the memory device.

11. The method of claim 9, wherein performing the read operation comprises determining whether data read from the memory device matches the number of user-defined burst patterns;

where the user-defined burst pattern is carried out in association with a media scan, and is based on the architecture of the memory device.

12. The method of claim 9, further comprising:

receiving the number of user-defined burst patterns from a host coupled to the controller; and writing the user-defined burst patterns to the number of registers.

13. The method of claim 9, further comprising performing a media scan operation initiated by a host coupled to the memory module, wherein performing the media scan operation comprises performing the BIST operation.

14. A system, comprising:

a host; and a memory module coupled to the host and comprising:

a number of memory devices; and a controller coupled to the number of memory devices and comprising:

a host interface configured to receive, from the host, a number of user-defined burst patterns that are based, at least in part on an architecture of at least one of the number of memory devices, built-in self-test (BIST) circuitry coupled to the host interface and comprising a number of registers, wherein each register is configured to store a respective one of the number of user-defined burst pattern;

wherein the controller further comprises a memory interface coupled to the BIST circuitry and the number of memory devices;

and wherein the controller further comprises error correction code (ECC) circuitry coupled to the BIST circuitry and the memory interface.

15. An apparatus, comprising:

a memory device; and a controller coupled to the memory device and comprising built-in self-test (BIST) circuitry comprising:

a first plurality of registers configured to store respective write burst patterns, wherein the write burst patterns are based, at least in part, on an architecture of the memory device;

a second plurality of registers configured to store respective read burst patterns, wherein the read burst patterns are based, at least in part, on the architecture of the memory device;

a front end portion coupled to the BIST circuitry and configured to interface with a host; and a back end portion coupled to the BIST circuitry and configured to interface with the memory device.

16. An apparatus, comprising:

a memory device; and a controller coupled to the memory device and comprising built-in self-test (BIST) circuitry comprising:

a first plurality of registers configured to store respective write burst patterns, wherein the write burst patterns are based, at least in part, on an architecture of the memory device; and a second plurality of registers configured to store respective read burst patterns, wherein the read burst patterns are based, at least in part, on the architecture of the memory device; and wherein the apparatus is a memory module that comprises a Compute Express Link (CXL) device.

17. A system, comprising:

a host; and a memory module coupled to the host and comprising:

a number of memory devices; and a controller coupled to the number of memory devices and comprising:

a host interface configured to receive, from the host, a number of user-defined burst patterns that are based, at least in part on an architecture of at least one of the number of memory devices, built-in self-test (BIST) circuitry coupled to the host interface and comprising a number of registers, wherein each register is configured to store a respective one of the number of user-defined burst pattern;

wherein the BIST circuitry is further configured to perform a plurality of BIST operations on the number of memory devices using the number of user-defined burst patterns; and wherein the BIST circuitry further comprises a control register configured to receive a bit string indicative of a particular one of the plurality of BIST operations and a particular one of the number of user-defined burst patterns.

* * * * *